United States Patent
Wu et al.

(10) Patent No.: US 7,736,920 B1
(45) Date of Patent: Jun. 15, 2010

(54) LED PACKAGE STRUCTURE WITH STANDBY BONDING PADS FOR INCREASING WIRE-BONDING YIELD AND METHOD FOR MANUFACTURING THE SAME

(75) Inventors: Chao-Chin Wu, Taipei (TW); Shen-Ta Yang, Taipei (TW)

(73) Assignee: Paragon Semiconductor Lighting Technology Co., Ltd., Taoyuan County (TW)

( * ) Notice: Subject to any disclaimer, the term of this patent is extended or adjusted under 35 U.S.C. 154(b) by 0 days.

(21) Appl. No.: 12/559,801

(22) Filed: Sep. 15, 2009

(30) Foreign Application Priority Data

Jun. 26, 2009 (TW) .............................. 98121675 A (51) Int. Cl.
*H01L 21/00* (2006.01)
*H01L 21/66* (2006.01)

(52) U.S. Cl. .............................. 438/22; 438/14; 438/15; 438/23; 438/82; 257/E21.001; 257/E21.088; 257/E33.055; 257/E33.056

(58) Field of Classification Search .......... 257/E21.001, 257/E21.088, E33.055, E33.056
See application file for complete search history.

(56) References Cited

U.S. PATENT DOCUMENTS

| 2005/0045904 A1* | 3/2005 | Chen ........................... 257/100 |
| 2005/0087866 A1* | 4/2005 | Shei et al. .................... 257/738 |
| 2006/0208364 A1* | 9/2006 | Wang et al. .................. 257/778 |

* cited by examiner

*Primary Examiner*—Charles D Garber
*Assistant Examiner*—Mohsen Ahmadi
(74) *Attorney, Agent, or Firm*—Kile Goekjian Reed & McManus PLLC (57) ABSTRACT

An LED package structure with standby bonding pads for increasing wire-bonding yield includes a substrate unit, a light-emitting unit, a conductive wire unit and a package unit. The substrate unit has a substrate body and a plurality of positive pads and negative pads. The light-emitting unit has a plurality of LED chips. The positive electrode of each LED chip corresponds to at least two of the positive pads, and the negative electrode of each. LED chip corresponds to at least two of the negative pads. Every two wires of the conductive wire unit are respectively electrically connected between the positive electrode of each LED chip and one of the at least two positive pads and between the negative electrode of each LED chip and one of the at least two negative pads. The package unit has a translucent package resin body on the substrate body to cover the LED chips.

8 Claims, 6 Drawing Sheets

LED PACKAGE STRUCTURE WITH STANDBY BONDING PADS FOR INCREASING WIRE-BONDING YIELD AND METHOD FOR MANUFACTURING THE SAME

CROSS-REFERENCE TO RELATED APPLICATION

This application claims priority under 35 U.S.C. §119 to Taiwan Patent Application No. 098121675, filed on Jun. 26, 2009, in the Taiwan Intellectual Property Office, the entire contents of which are hereby incorporated by reference.

BACKGROUND OF THE INVENTION

1. Field of the Invention

The present invention relates to an LED package structure and a method for manufacturing the same, in particular, to an LED package structure with standby bonding pads for increasing wire-bonding yield and a method for manufacturing the same.

2. Description of Related Art

The invention of the lamp greatly changed the style of building construction and the living style of human beings, allowing people to work during the night. Without the invention of the lamp, we may stay in the living conditions of ancient civilizations.

Various lamps such as incandescent bulbs, fluorescent bulbs, power-saving bulbs and etc. have been intensively used for indoor illumination. These lamps commonly have the disadvantages of quick attenuation, high power consumption, high heat generation, short working life, high fragility, and being not recyclable. Further, the rapid flow of electrons (about 120 per second) through the electrodes of a regular fluorescent bulb causes an unstable current at the onset of lighting a fluorescent bulb, resulting in a flash of light that is harmful to the sight of the eyes. In order to eliminate this problem, a high frequency electronic ballast may be used. When a fluorescent or power-saving bulb is used with high frequency electronic ballast, it saves about 20% of the consumption of power and eliminates the problem of flashing. However, the high frequency electronic ballast is not detachable when installed in a fluorescent or power-saving bulb, the whole lamp assembly becomes useless if the bulb is damaged. Furthermore, because a fluorescent bulb contains a mercury coating, it may cause pollution to the environment when thrown away after damage.

Figure 1:
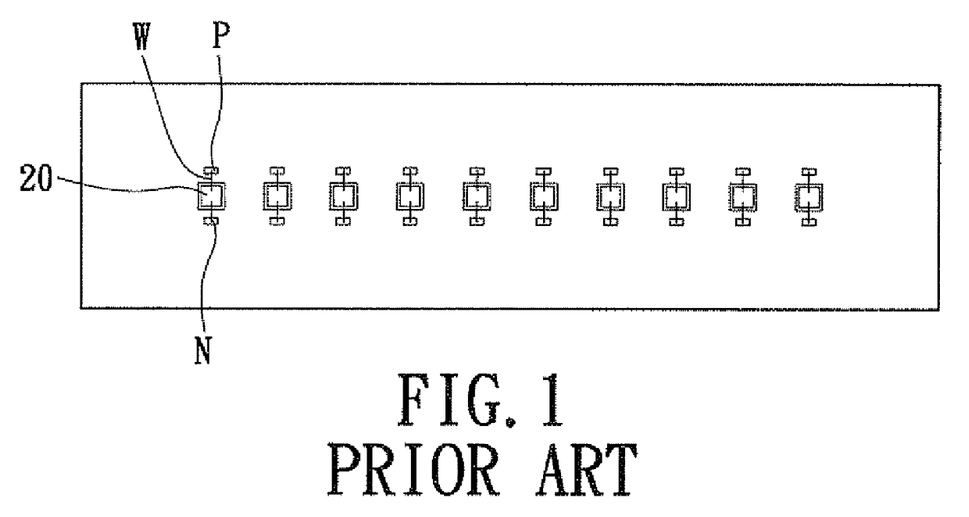
FIG. 1 is a top, schematic view of the LED package structure according to the prior art.

Hence, LED lamp or LED tube is created in order to solve the above-mentioned questions of the prior lamp. Referring to FIG. 1, the LED package structure of the prior art includes a plurality of LED chips 20. The positive electrode (not shown) and the negative electrode (not shown) of each LED chip 20 respectively correspond to one positive pad P and one negative pad N. Hence, when one end of a wire W does not correctly connect with the positive pad P or the negative pad. N (it means that the wire W does not electrically connect with the positive pad P or the negative pad N (such as floating solder)), the manufacturer firstly needs to clean solder splash on the surface of the positive pad P or the negative pad N, and then making the same end of the wire W bond on the clean surface of the positive pad P or the negative pad N again. Therefore, the prior art increases wire-bonding time (decreases wire-bonding efficiency) and decreases wire-bonding yield.

SUMMARY OF THE INVENTION

In view of the aforementioned issues, the present invention provides an LED package structure with standby bonding pads for increasing wire-bonding yield and a method for manufacturing the same. The positive electrode and the negative electrode of each LED chip respectively correspond to at least two of the positive pads and at least two of the negative pads, so that the positive electrode of each LED chip has at least one standby positive pad and the negative electrode of each LED chip has at least one standby negative pad, in order to decrease wire-bonding time (increase wire-bonding efficiency) and increase wire-bonding yield.

To achieve the above-mentioned objectives, the present invention provides an LED package structure with standby bonding pads for increasing wire-bonding yield, including: a substrate unit, a light-emitting unit, a conductive wire unit and a package unit. The substrate unit has a substrate body and a plurality of positive pads and negative pads disposed on a top surface of the substrate body. The light-emitting unit has a plurality of LED chips electrically disposed on the top surface of the substrate body. Each LED chip has a positive electrode and a negative electrode, the positive electrode of each LED chip corresponds to at least two of the positive pads, and the negative electrode of each LED chip corresponds to at least two of the negative pads. The conductive wire unit has a plurality of wires. Every two wires are respectively electrically connected between the positive electrode of each LED chip and one of the at least two positive pads and between the negative electrode of each LED chip and one of the at least two negative pads. The package unit has a translucent package resin body disposed on the top surface of the substrate body in order to cover the LED chips.

To achieve the above-mentioned objectives, the present invention provides an LED package structure with standby bonding pads for increasing wire-bonding yield, including: a substrate unit, a light-emitting unit, a conductive wire unit and a package unit. The substrate unit has a substrate body and a plurality of first pads and second pads disposed on a top surface of the substrate body. The light-emitting unit has a plurality of LED chips electrically disposed on the top surface of the substrate body. Each LED chip has two electrodes, one of the two electrodes of each LED chip corresponds to at least two of the first pads, and another one of the two electrodes of each LED chip is electrically contacted with each second pad. The conductive wire unit has a plurality of wires. Each wire is electrically connected between one of the two electrodes of each LED chip and one of the two first pads. The package unit has a translucent package resin body disposed on the top surface of the substrate body in order to cover the LED chips.

To achieve the above-mentioned objectives, the present invention provides a method of manufacturing an LED package structure with standby bonding pads for increasing wire-bonding yield, including: providing a substrate unit, wherein the substrate unit has a substrate body and a plurality of positive pads and negative pads disposed on a top surface of the substrate body; electrically arranging a plurality of LED chips on the top surface of the substrate body, wherein each LED chip has a positive electrode and a negative electrode, the positive electrode of each LED chip corresponds to at least two of the positive pads, and the negative electrode of each LED chip corresponds to at least two of the negative pads; electrically connecting the LED chips between the positive pads and the negative pads by a plurality of wires, wherein every two wires are respectively electrically connected between the positive electrode of each LED chip and one of the at least two positive pads and between the negative electrode of each LED chip and one of the at least two negative pads, wherein if an end of any one of the wires does not correctly connect with one of the at least two positive pads or the at least two negative pads, making the end of the wire connect to another one of the at least two positive pads or the at least two negative pads; and than forming a translucent package resin body on the top surface of the substrate body in order to cover the LED chips.

Therefore, when a first end of the wire does not correctly connect with first one of the at least two positive pads or the at least two negative pads (it means that the wire does not electrically connect with the first one of the at least two positive pads or the at least two negative pads (such as floating solder)), the manufacturer can make the same first end of the wire connect to another one of the at least two positive pads or the at least two negative pads without cleaning solder splash on the surface of the first one of the at least two positive pads or the at least two negative pads, in order to decrease wire-bonding time (increase wire-bonding efficiency) and increase wire-bonding yield.

In order to further understand the techniques, means and effects the present invention takes for achieving the prescribed objectives, the following detailed descriptions and appended drawings are hereby referred, such that, through which, the purposes, features and aspects of the present invention can be thoroughly and concretely appreciated; however, the appended drawings are merely provided for reference and illustration, without any intention to be used for limiting the present invention.

DETAILED DESCRIPTION OF THE PREFERRED EMBODIMENTS

Figure 2A:
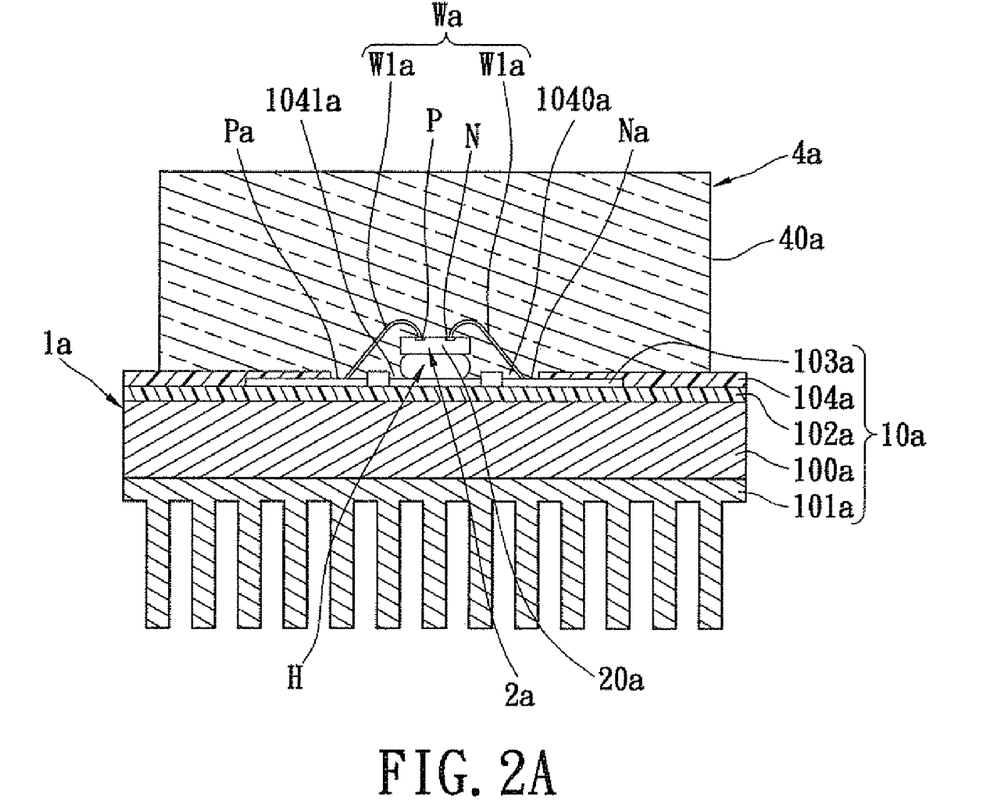
FIG. 2A is a cross-sectional, schematic view of the LED package structure according to the first embodiment of the present invention.
Figure 2B:
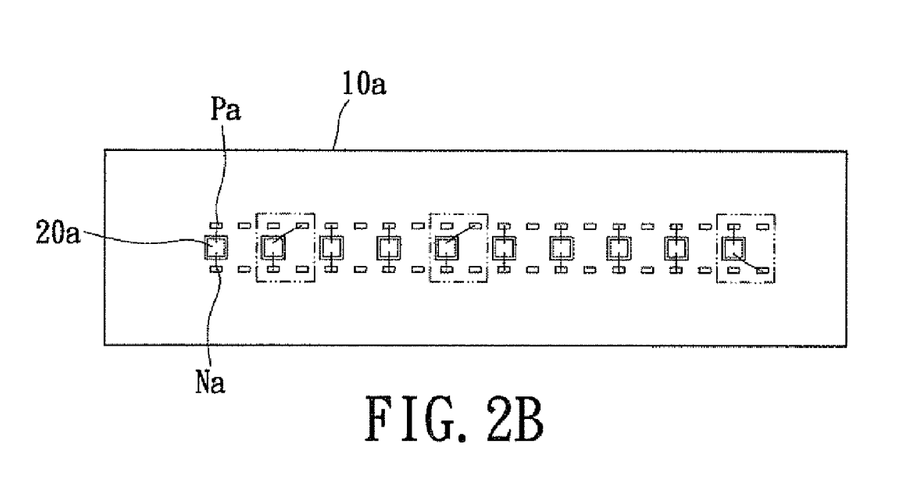
FIG. 2B is a top, schematic view of the LED package structure according to the first embodiment of the present invention (the package unit has been removed)

Referring to FIGS. 2A and 2B, the first embodiment of the present invention provides an LED package structure with standby bonding pads for increasing wire-bonding yield, including: a substrate unit 1a, a light-emitting unit 2a, a conductive wire unit Wa and a package unit 4a.

The substrate unit 1a has a substrate body 10a and a plurality of positive pads Pa and negative pads Na disposed on a top surface of the substrate body 10a. Furthermore, the substrate body 10a has a heat-dissipating substrate 100a, a heat sink 101a disposed on a bottom surface of the heat-dissipating substrate 100a (the heat sink 101a is composed of a plurality of heat-dissipating fins), a first insulating layer 102a disposed on a top surface of the heat-dissipating substrate 100a, at least two conductive layers 103a separated from each other and disposed on the first insulating layer 102a, and a second insulating layer 104a with a plurality of pad openings 1040a and chip openings 1041a for covering the at least two conductive layers 103a. The positive pads Pa disposed on one of the conductive layers 103a and the negative pads Na disposed on the other conductive layer 103a are respectively exposed by the pad openings 1040a of the second insulating layer 104a.

Moreover, the light-emitting unit 2a has a plurality of LED chips 20a electrically disposed on the top surface of the substrate body 10a. Each LED chip 20a has a positive electrode P and a negative electrode N. The positive electrode P of each LED chip 20a corresponds to at least two of the positive pads Pa, and the negative electrode N of each LED chip 20a corresponds to at least two of the negative pads Na (as shown in the phantom lines of FIG. 2B). In other words, the positive electrode P of each LED chip 20a can selectively electrically connected to one of the at least two positive pads Pa (as shown in the first and the second phantom lines of FIG. 2B), and the negative electrode N of each LED chip 20a can selectively electrically connected to one of the at least two negative pads Na (as shown in the third phantom lines of FIG. 2B). In addition, each LED chip 20a is disposed in or above each chip opening 1041a and on the first insulating layer 102a by an adhesive layer H.

Furthermore, the conductive wire unit Wa has a plurality of wires W1a. Every two wires W1a are respectively electrically connected between the positive electrode P of each LED chip 20a and one of the at least two positive pads Pa (another positive pad Pa as a standby bonding pad that does not be touched by the wire W1a) and between the negative electrode N of each LED chip 20a and one of the at least two negative pads Na (another negative pad Na as a standby bonding pad that does not be touched by the wire W1a). In other words, one end of each wire W1a is electrically connected to the positive electrode P or the negative electrode N of each LED chip 20a, and another end of each wire W1a is electrically connected to one of the at least two positive pads Pa or one of the at least two negative pads Na.

Hence, when a first end of the wire W1a does not correctly connect with first one of the at least two positive pads Pa or the at least two negative pads Na (it means that the wire W1a does not electrically connect with the first one of the at least two positive pads Pa or the at least two negative pads Na (such as floating solder)), the manufacturer can make the same first end of the wire W1a connect to another one of the at least two positive pads Pa or the at least two negative pads Na without cleaning solder splash on the surface of the first one of the at least two positive pads Pa or the at least two negative pads Na, in order to decrease wire-bonding time (increase wire-bonding efficiency) and increase wire-bonding yield.

Furthermore, the package unit 4a has a translucent package resin body 40a disposed on the top surface of the substrate body 10a in order to cover the LED chips 20a. The translucent package resin body 40a can be a transparent resin or a resin mixed with phosphor powders.

Figure 3:
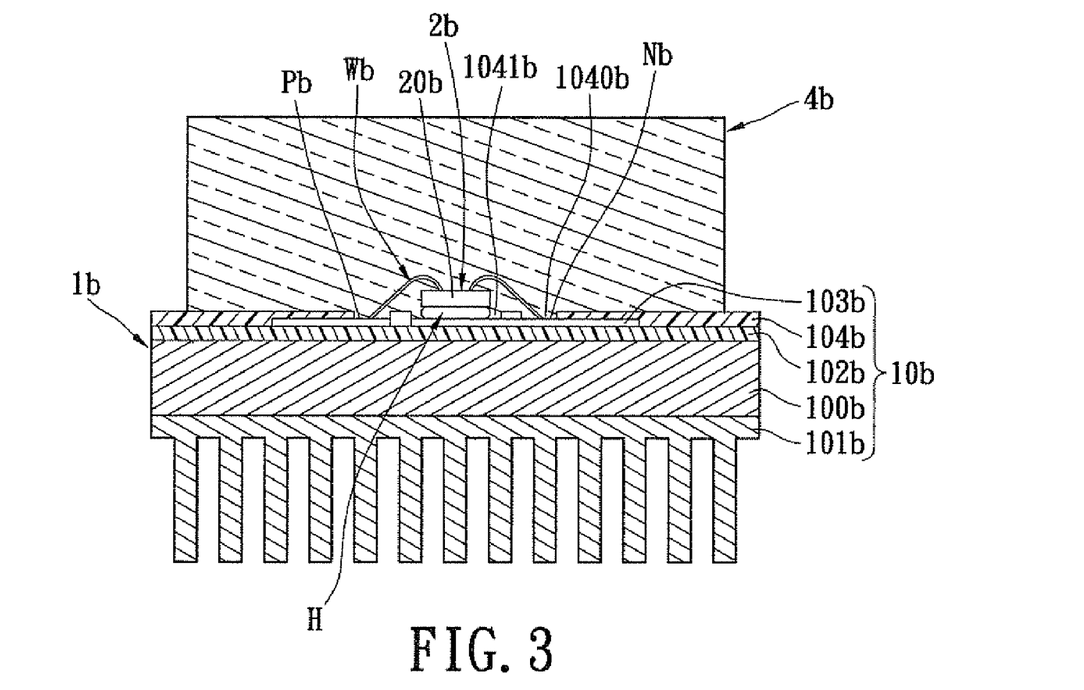
FIG. 3 is a cross-sectional, schematic view of the LED package structure according to the second embodiment of the present invention.

Referring to FIG. 3, the second embodiment of the present invention provides an LED package structure with standby bonding pads for increasing wire-bonding yield, including: a substrate unit 1b, a light-emitting unit 2b, a conductive wire unit Wb and a package unit 4b. Moreover, the substrate body 10b has a heat-dissipating substrate 100b, a heat sink 101b disposed on a bottom surface of the heat-dissipating substrate 100b, a first insulating layer 102b disposed on a top surface of the heat-dissipating substrate 100b, at least two conductive layers 103b separated from each other and disposed on the first insulating layer 102b, and a second insulating layer 104b with a plurality of pad openings 1040b and chip openings 1041b for covering the at least two conductive layers 103b. The positive pads Pb disposed on one of the conductive layers 103b and the negative pads Nb disposed on the other conductive layer 103b are respectively exposed by the pad openings 1040b of the second insulating layer 104b. In addition, each LED chip 20b is disposed in or above each chip opening 1041b and on one of the conductive layers 103b by an adhesive layer H.

Hence, the difference between the second embodiment and the first embodiment is that: in the second embodiment, each LED chip 20b is disposed on one of the conductive layers 103b by the adhesive layer H.

Figure 4:
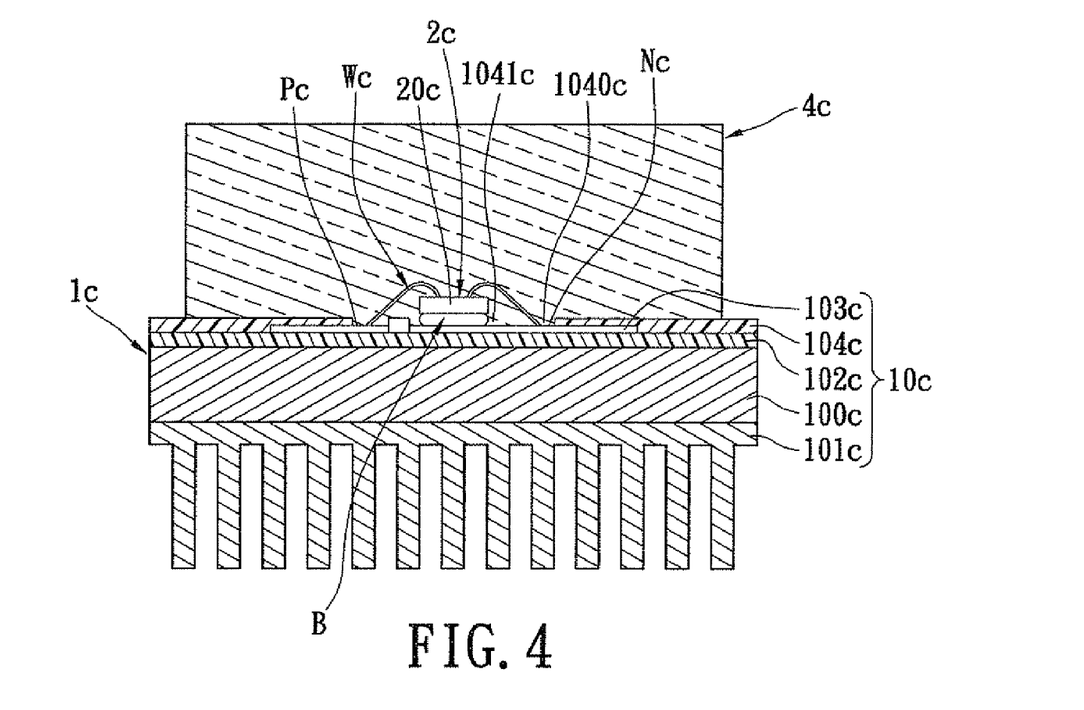
FIG. 4 is a cross-sectional, schematic view of the LED package structure according to the third embodiment of the present invention.

Referring to FIG. 4, the third embodiment of the present invention provides an LED package structure with standby bonding pads for increasing wire-bonding yield, including: a substrate unit 1c, a light-emitting unit 2c, a conductive wire unit Wc and a package unit 4c. Moreover, the substrate body 10c has a heat-dissipating substrate 100c, a heat sink 101c disposed on a bottom surface of the heat-dissipating substrate 100c, a first insulating layer 102c disposed on a top surface of the heat-dissipating substrate 100c, at least two conductive layers 103c separated from each other and disposed on the first insulating layer 102c, and a second insulating layer 104c with a plurality of pad openings 1040c and chip openings 1041c for covering the at least two conductive layers 103c. The positive pads Pc disposed on one of the conductive layers 103c and the negative pads Nc disposed on the other conductive layer 103c are respectively exposed by the pad openings 1040c of the second insulating layer 104c. In addition, each LED chip 20c is disposed in or above each chip opening 1041c and on one of the conductive layers 103c by solder balls B (or solder paste).

Hence, the difference between the third embodiment and the second embodiment is that: in the third embodiment, each LED chip 20c is disposed on one of the conductive layers 103c by the solder balls B (or solder paste).

Figure 5:
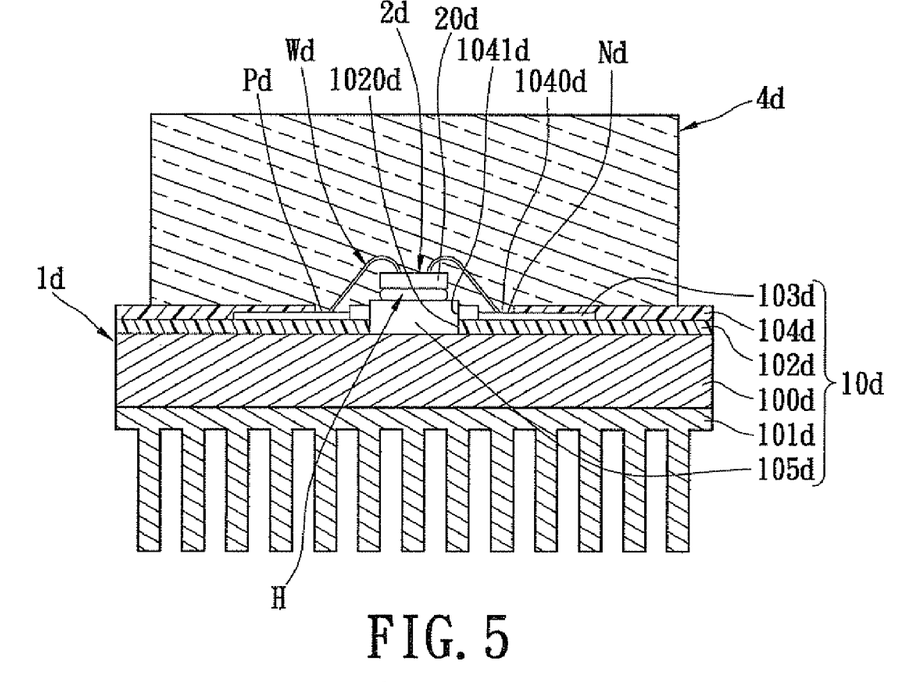
FIG. 5 is a cross-sectional, schematic view of the LED package structure according to the fourth embodiment of the present invention.

Referring to FIG. 5, the fourth embodiment of the present invention provides an LED package structure with standby bonding pads for increasing wire-bonding yield, including: a substrate unit 1d, a light-emitting unit 2d, a conductive wire unit Wd and a package unit 4d. Moreover, the substrate body 10d has a heat-dissipating substrate 100d, a heat sink 101d disposed on a bottom surface of the heat-dissipating substrate 100d, a first insulating layer 102d with a plurality of openings 1020d disposed on a top surface of the heat-dissipating substrate 100d, a plurality of heat-conducting blocks 105d respectively filled into the openings 1020d of the first insulating layer 102d and contacted with the heat-dissipating substrate 100d, at least two conductive layers 103d separated from each other and disposed on the first insulating layer 102d, and a second insulating layer 104d with a plurality of pad openings 1040d and chip openings 1041d for covering the at least two conductive layers 103d. The positive pads Pd disposed on one of the conductive layers 103d and the negative pads Nd disposed on the other conductive layer 103d are respectively exposed by the pad openings 1040d of the second insulating layer 104d, and each LED chip 20d is disposed in or above each chip opening 1041d and on each heat-conducting block 105d by an adhesive layer H.

Hence, the difference between the fourth embodiment and the above-mentioned embodiments is that: in the fourth embodiment, the first insulating layer 102d with the openings 1020d is disposed on the top surface of the heat-dissipating substrate 100d, the heat-conducting blocks 105d are respectively filled into the openings 1020d of the first insulating layer 102d and contacted with the heat-dissipating substrate 100d, and each LED chip 20d is disposed on each heat-conducting block 105d by the adhesive layer H.

Figure 6:
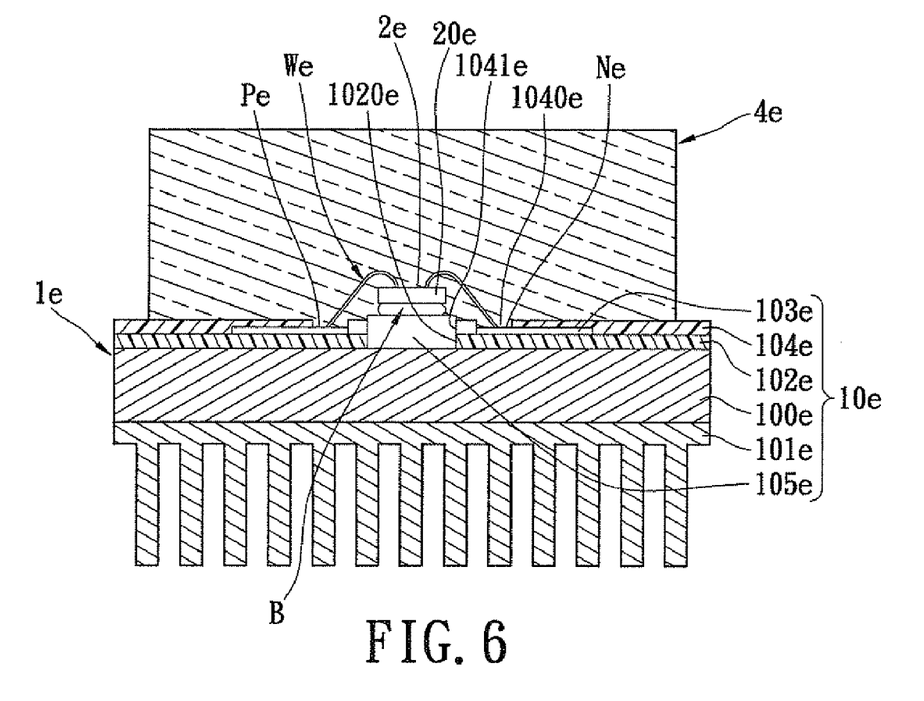
FIG. 6 is a cross-sectional, schematic view of the LED package structure according to the fifth embodiment of the present invention.

Referring to FIG. 6, the fifth embodiment of the present invention provides an LED package structure with standby bonding pads for increasing wire-bonding yield, including: a substrate unit 1e, a light-emitting unit 2e, a conductive wire unit We and a package unit 4e. Moreover, the substrate body 10e has a heat-dissipating substrate 100; a heat sink 101e disposed on a bottom surface of the heat-dissipating substrate 100e, a first insulating layer 102e with a plurality of openings 1020e disposed on a top surface of the heat-dissipating substrate 100e, a plurality of heat-conducting blocks 105e respectively filled into the openings 1020e of the first insulating layer 102e and contacted with the heat-dissipating substrate 100e, at least two conductive layers 103e separated from each other and disposed on the first insulating layer 102e, and a second insulating layer 104e with a plurality of pad openings 1040e and chip openings 1041e for covering the at least two conductive layers 103e. The positive pads Pe disposed on one of the conductive layers 103e and the negative pads Ne disposed on the other conductive layer 103e are respectively exposed by the pad openings 1040e of the second insulating layer 104e, and each LED chip 20e is disposed in or above each chip opening 1041e and on each heat-conducting block 105e by solder balls B (or solder paste).

Hence, the difference between the fifth embodiment and the fourth embodiments is that: in the fifth embodiment, each LED chip 20e is disposed on each heat-conducting block 105e by the solder balls B (or solder paste).

Figure 7:
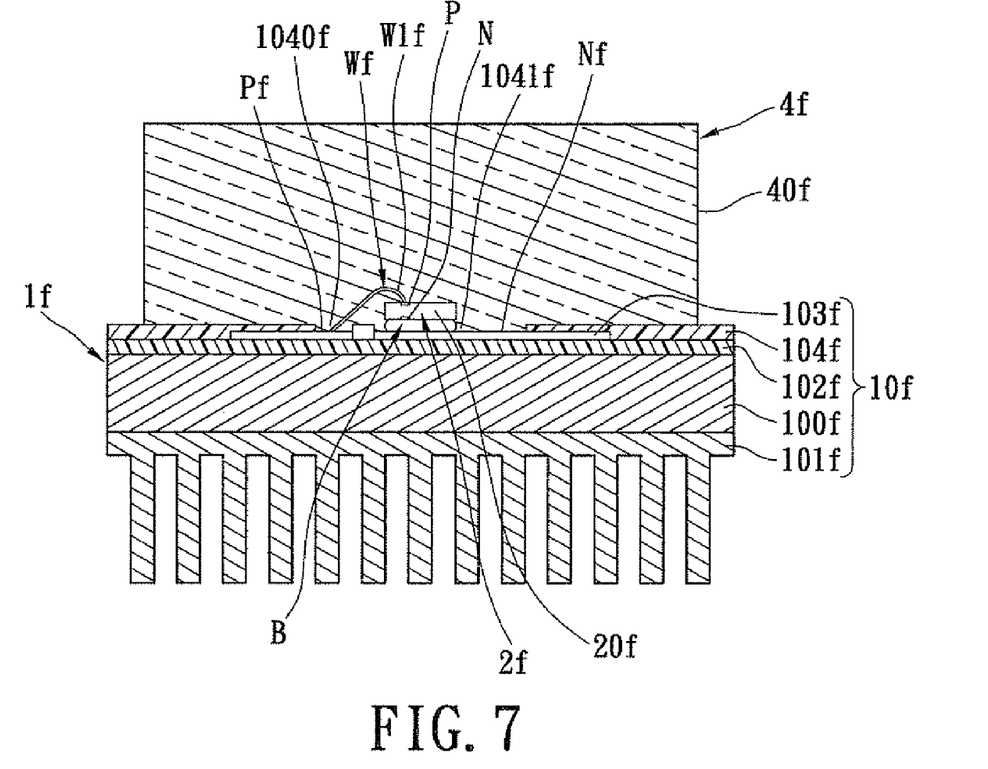
FIG. 7 is a cross-sectional, schematic view of the LED package structure according to the sixth embodiment of the present invention.

Referring to FIG. 7, the sixth embodiment of the present invention provides an LED package structure with standby bonding pads for increasing wire-bonding yield, including: a substrate unit 1f, a light-emitting unit 2f, a conductive wire unit Wf and a package unit 4f.

The substrate unit if has a substrate body 10f and a plurality of first pads Pf and second pads Nf disposed on a top surface of the substrate body 10f. The light-emitting unit 2f has a plurality of LED chips 20f electrically disposed on the top surface of the substrate body 10f. In addition, each LED chip 20f has two electrodes (P and N), one of the two electrodes (such as the electrode P) of each LED chip 20f corresponds to at least two of the first pads Pf, and another one of the two electrodes (such as the electrode N) of each LED chip 20f is electrically contacted with each second pad Nf.

Furthermore, the conductive wire unit Wf has a plurality of wires W1f. Each wire W1f is electrically connected between one of the two electrodes (such as the electrode P) of each LED chip 20a and one of the two first pads P1. In addition, the package unit 4f has a translucent package resin body 40f disposed on the top surface of the substrate body 10f in order to cover the LED chips 20f.

Moreover, the substrate body 10f has a heat-dissipating substrate 100f, a heat sink 101f disposed on a bottom surface of the heat-dissipating substrate 100f, a first insulating layer 102f disposed on a top surface of the heat-dissipating substrate 100f, at least two conductive layers 103f separated from each other and disposed on the first insulating layer 102f, and a second insulating layer 104f with a plurality of pad openings 1040*f* and chip openings 1041*f* for covering the at least two conductive layers 103*f*. In addition, the first pads Pf disposed on one of the conductive layers 103*f* and the second pads Nf disposed on the other conductive layer 103*f* are respectively exposed by the pad openings 1040*f* of the second insulating layer 104*f*. Each LED chip 20*f* is disposed in or above each chip opening 1041*f*, and the LED chips 20*f* and the second pads Nf are disposed on the same conductive layer 103*f* by solder balls B (or solder paste).

Figure 8:
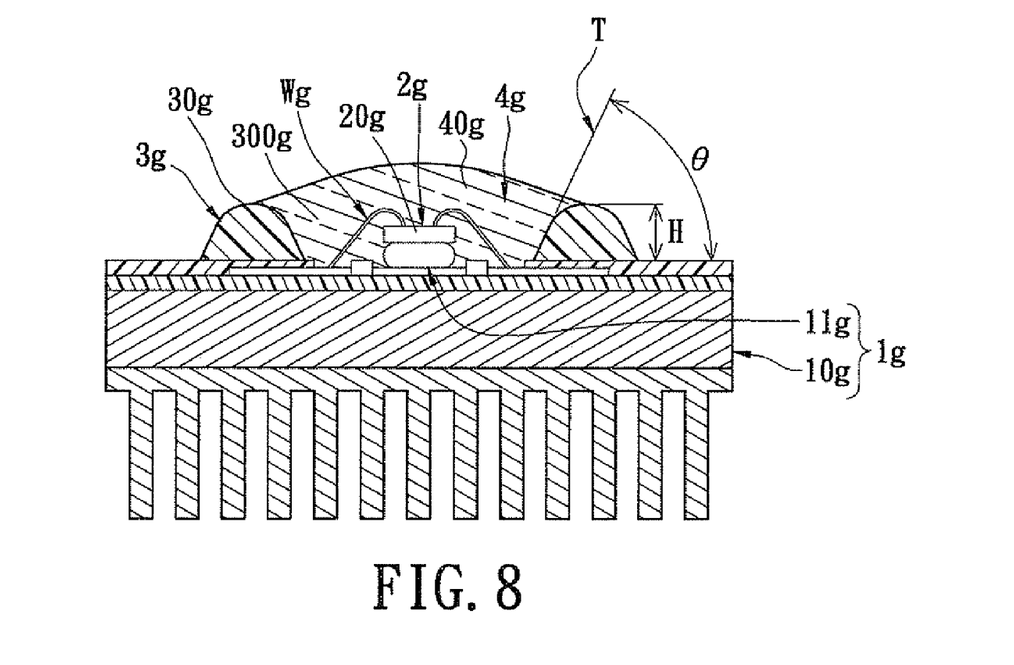
FIG. 8 is a cross-sectional, schematic view of the LED package structure according to the seventh embodiment of the present invention.

Referring to FIG. 8, the seventh embodiment of the present invention provides an LED package structure with standby bonding pads for increasing wire-bonding yield, including: a substrate unit 1*g*, a light-emitting unit 2*g*, a conductive wire unit Wg, a light-reflecting unit 3*g* and a package unit 4*g*.

The light-reflecting unit 3*g* has an annular reflecting resin body 30*g* surroundingly formed on the top surface of the substrate body 10*g* by coating. The annular reflecting resin body 30*g* surrounds the LED chips 20*g* to form a resin position limiting space 300*g* above the substrate body 10*g*. The substrate unit 1*g* has a chip-placing area 11*g* disposed on the top surface of the substrate body 10*g*, the LED chips 20*g* are disposed on the chip-placing area 11*g*, and the position of the translucent package resin body 40*g* is limited in the resin position limiting space 300*g*.

Moreover, the annular reflecting resin body 30*g* has an arc shape formed on a top surface thereof. The annular reflecting resin body 30*g* has a radius tangent T and the angle θ of the radius tangent T relative to the top surface of the substrate body 10*g* is between 40° C. and 50° C. The maximum height H of the annular reflecting resin body 30*g* relative to the top surface of the substrate body 10*g* is between 0.3 mm and 0.7 mm. The width of a bottom side of the annular reflecting resin body 30*g* is between 1.5 mm and 3 mm. The thixotropic index of the annular reflecting resin body 30*g* is between 4 and 6, and the annular reflecting resin body 30*g* can be a white thermohardening reflecting body mixed with inorganic additive.

Figure 9:
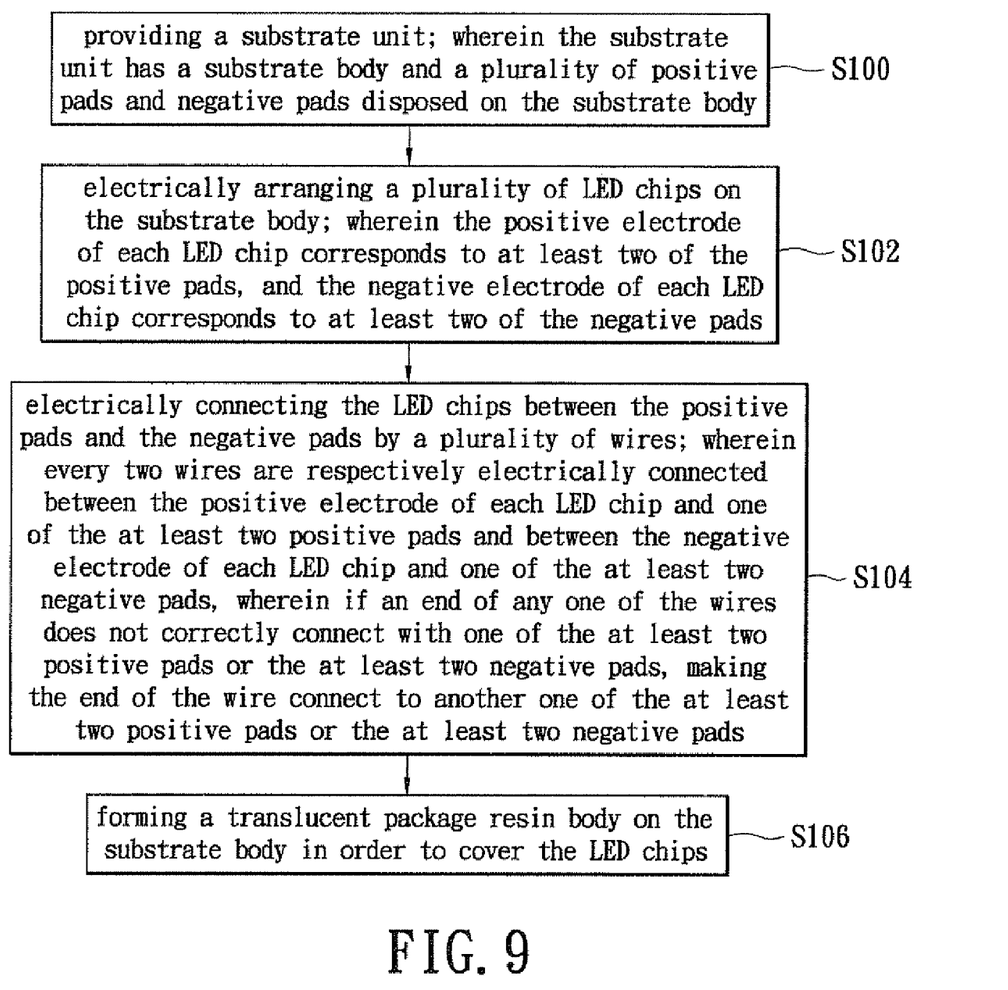
FIG. 9 is a flowchart of the method for manufacturing the LED package structure according to the first embodiment of the present invention.

Referring to FIG. 9, the present invention provides a method for manufacturing an LED package structure with standby bonding pads for increasing wire-bonding yield. For example, in the first embodiment, the method includes: providing a substrate unit 1*a*; wherein the substrate unit 1*a* has a substrate body 10*a* and a plurality of positive pads Pa and negative pads Na disposed on a top surface of the substrate body 10*a* (S100); and then electrically arranging a plurality of LED chips 20*a* on the top surface of the substrate body 10*a*; wherein each LED chip 20*a* has a positive electrode P and a negative electrode N, the positive electrode P of each LED chip 20*a* corresponds to at least two of the positive pads Pa, and the negative electrode N of each LED chip 20*a* corresponds to at least two of the negative pads Na (S102).

Furthermore, the method further includes: electrically connecting the LED chips 20*a* between the positive pads Pa and the negative pads Na by a plurality of wires W1*a*; wherein every two wires W1*a* are respectively electrically connected between the positive electrode P of each LED chip 20*a* and one of the at least two positive pads Pa and between the negative electrode N of each LED chip 20*a* and one of the at least two negative pads Na, wherein if an end of any one of the wires W1*a* does not correctly connect with one of the at least two positive pads Pa or the at least two negative pads Na, making the end of the wire W1*a* connect to another one of the at least two positive pads Pa or the at least two negative pads Na (S104); and then forming a translucent package resin body 40*a* on the top surface of the substrate body 10*a* in order to cover the LED chips 20*a* (S106).

In addition, before the step of forming the translucent package resin body 40*a*, the method includes: surroundingly forming an annular reflecting resin body (such as the annular reflecting resin body 30*g* shown in FIG. 8) on the top surfaces of the substrate body 10*a* by coating.

In other words, liquid resin (not shown) can be surroundingly coated on the top surface of the substrate body 10*a*, and then hardening the liquid resin to form the annular reflecting resin body (such as the annular reflecting resin body 30*g* shown in FIG. 8). Furthermore, the liquid resin can be coated on the substrate body 10*a* by any shapes according to different requirements (such as a circular shape, a square or a rectangular shape etc.). In addition, the thixotropic index of the liquid resin is between 4 and 6, the pressure of coating the liquid resin on the top surface of the substrate body 10*a* is between 350 kpa and 450 kpa, and the velocity of coating the liquid resin on the top surface of the substrate body 10*a* is between 5 mm/s and 15 mm/s. The liquid resin is surroundingly coated on the top surface of the substrate body 10*a* from a start point to a termination point, and the position of the start point and the position of the termination point are the same. In addition, the liquid resin is hardened by baking, the baking temperature is between 120° C. and 140° C., and the baking time is between 20 minute and 40 minute.

In conclusion, the positive electrode and the negative electrode of each LED chip respectively correspond to at least two of the positive pads and at least two of the negative pads, so that the positive electrode of each LED chip has at least one standby positive pad and the negative electrode of each LED chip has at least one standby negative pad.

Hence, when a first end of the wire does not correctly connect with first one of the at least two positive pads or the at least two negative pads (it means that the wire does not electrically connect with the first one of the at least two positive pads or the at least two negative pads (such as floating solder)), the manufacturer can make the same first end of the wire connect to another one of the at least two positive pads or the at least two negative pads without cleaning solder splash on the surface of the first one of the at least two positive pads or the at least two negative pads, in order to decrease wire-bonding time (increase wire-bonding efficiency) and increase wire-bonding yield.

The above-mentioned descriptions represent merely the preferred embodiment of the present invention, without any intention to limit the scope of the present invention thereto. Various equivalent changes, alternations or modifications based on the claims of present invention are all consequently viewed as being embraced by the scope of the present invention.

What is claimed is:

1. A method for manufacturing an LED package structure with standby bonding pads for increasing wire-bonding yield, comprising:

providing a substrate unit, wherein the substrate unit has a substrate body and a plurality of positive pads and negative pads disposed on a top surface of the substrate body;

electrically arranging a plurality of LED chips on the top surface of the substrate body, wherein each LED chip has a positive electrode and a negative electrode, the positive electrode of each LED chip corresponds to at least two of the positive pads, and the negative electrode of each LED chip corresponds to at least two of the negative pads;

electrically connecting the LED chips between the positive pads and the negative pads by a plurality of wires, wherein every two wires are respectively electrically connected between the positive electrode of each LED chip and one of the at least two positive pads and between the negative electrode of each LED chip and one of the at least two negative pads, wherein if an end of any one of the wires does not correctly connect with one of the at least two positive pads or the at least two negative pads, making the end of the wire connect to another one of the at least two positive pads or the at least two negative pads; and forming a translucent package resin body on the top surface of the substrate body in order to cover the LED chips.

2. The method according to claim 1, wherein before the step of forming the translucent package resin body, the method comprises: surroundingly forming an annular reflecting resin body on the top surfaces of the substrate body by coating, wherein each annular reflecting resin body surrounds the LED chips to form a resin position limiting space above the substrate body, the position of the translucent package resin body is limited in the resin position limiting space, the substrate unit has a chip-placing area disposed on the top surface of the substrate body, and the LED chips are disposed on the chip-placing area.

3. The method according to claim 2, wherein the annular reflecting resin body has an arc shape formed on a top surface thereof, the annular reflecting resin body has a radius tangent and the angle of the radius tangent relative to the top surface of the substrate body is between 40° C. and 50° C., the maximum height of the annular reflecting resin body relative to the top surface of the substrate body is between 0.3 mm and 0.7 mm, the width of a bottom side of the annular reflecting resin body is between 1.5 mm and 3 mm, the thixotropic index of the annular reflecting resin body is between 4 and 6, and the annular reflecting resin body is a white thermohardening reflecting body mixed with, inorganic additive.

4. The method according to claim 1, wherein the substrate body has a heat-dissipating substrate, a heat sink disposed on a bottom surface of the heat-dissipating substrate, a first insulating layer disposed on a top surface of the heat-dissipating substrate, at least two conductive layers separated from each other and disposed on the first insulating layer, and a second insulating layer with a plurality of pad openings and chip openings for covering the at least two conductive layers, wherein the positive pads disposed on one of the conductive layers and the negative pads disposed on the other conductive layer are respectively exposed by the pad openings of the second insulating layer, and each LED chip is disposed in or above each chip opening and on the first insulating layer by an adhesive layer.

5. The method according to claim 1, wherein the substrate body has a heat-dissipating substrate, a heat sink disposed on a bottom surface of the heat-dissipating substrate, a first insulating layer disposed on a top surface of the heat-dissipating substrate, at least two conductive layers separated from each other and disposed on the first insulating layer, and a second insulating layer with a plurality of pad openings and chip openings for covering the at least two conductive layers, wherein the positive pads disposed on one of the conductive layers and the negative pads disposed on the other conductive layer are respectively exposed by the pad openings of the second insulating layer, and each LED chip is disposed in or above each chip opening and on one of the conductive layers by an adhesive layer.

6. The method according to claim 1, wherein the substrate body has a heat-dissipating substrate, a heat sink disposed on a bottom surface of the heat-dissipating substrate, a first insulating layer disposed on a top surface of the heat-dissipating substrate, at least two conductive layers separated from each other and disposed on the first insulating layer, and a second insulating layer with a plurality of pad openings and chip openings for covering the at least two conductive layers, wherein the positive pads disposed on one of the conductive layers and the negative pads disposed on the other conductive layer are respectively exposed by the pad openings of the second insulating layer, and each LED chip is disposed in or above each chip opening and on one of the conductive layers by solder balls or solder paste.

7. The method according to claim 1, wherein the substrate body has a heat-dissipating substrate, a heat sink disposed on a bottom surface of the heat-dissipating substrate, a first insulating layer with a plurality of openings disposed on a top surface of the heat-dissipating substrate, a plurality of heat-conducting blocks respectively filled into the openings of the first insulating layer and contacted with the heat-dissipating substrate, at least two conductive layers separated from each other and disposed on the first insulating layer, and a second insulating layer with a plurality of pad openings and chip openings for covering the at least two conductive layers, wherein the positive pads disposed on one of the conductive layers and the negative pads disposed on the other conductive layer are respectively exposed by the pad openings of the second insulating layer, and each LED chip is disposed in or above each chip opening and on each heat-conducting block by an adhesive layer.

8. The method according to claim 1, wherein the substrate body has a heat-dissipating substrate, a heat sink disposed on a bottom surface of the heat-dissipating substrate, a first insulating layer with a plurality of openings disposed on a top surface of the heat-dissipating substrate, a plurality of heat-conducting blocks respectively filled into the openings of the first insulating layer and contacted with the heat-dissipating substrate, at least two conductive layers separated from each other and disposed on the first insulating layer, and a second insulating layer with a plurality of pad openings and chip openings for covering the at least two conductive layers, wherein the positive pads disposed on one of the conductive layers and the negative pads disposed on the other conductive layer are respectively exposed by the pad openings of the second insulating layer, and each LED chip is disposed in or above each chip opening and on each heat-conducting block by solder balls or solder paste.

* * * * *